United States Patent [19]

Meyer et al.

[11] 4,020,474

[45] Apr. 26, 1977

[54] MANIPULATABLE READ-OUT MEMORY

[75] Inventors: Juergen Meyer, Taunusstein; Irmtrud Wendling, Wiesbaden, both of Germany

[73] Assignee: Heimann GmbH, Germany

[22] Filed: May 27, 1975

[21] Appl. No.: 580,919

[30] Foreign Application Priority Data

May 27, 1974 Germany .......................... 2425467
Mar. 7, 1975 Germany .......................... 7507226

[52] U.S. Cl. .................... 340/173 SP; 235/61.11 E
[51] Int. Cl.² ...................... G11B 7/24; G06K 7/14
[58] Field of Search ............. 235/61.11 E, 61.12 C; 340/173 SP, 166 R, 174 M; 250/569; 357/32, 68, 72; 317/234 S

[56] References Cited

UNITED STATES PATENTS

| | | | |
|---|---|---|---|
| 3,201,764 | 8/1965 | Parker | 235/61.11 E |
| 3,215,819 | 11/1965 | Smith | 235/61.11 E |
| 3,525,083 | 8/1970 | Slob | 340/173 SP |
| 3,611,319 | 10/1971 | Hyatt | 340/173 SP |
| 3,629,863 | 12/1971 | Neale | 340/173 SP |
| 3,818,252 | 6/1974 | Chiba | 340/173 SP |

*Primary Examiner*—Daryl W. Cook
*Assistant Examiner*—Robert M. Kilgore
*Attorney, Agent, or Firm*—Hill, Gross, Simpson, Van Santen, Steadman, Chiara & Simpson

[57] ABSTRACT

A manipulatable read-only memory, particularly a punched card read device, having conductor paths comprising row and column conductors, disposed in a matrix formation in the manner of a cross-bar distributor, adapted to be operatively connected at their respective intersections by a corresponding photo-resistor and a rectifier containing a blocking contact, which are connected in series with the blocking contact being formed directly on one of the two conductors.

13 Claims, 6 Drawing Figures

III
8
6
2
1
6
1
2
1
6
III

MANIPULATABLE READ-OUT MEMORY

BACKGROUND OF THE INVENTION

The invention relates to a manipulatable read-only memory, in particular a punched card read device, with conductor paths, i.e. row conductors and column conductors disposed in a matrix formation in the manner of a cross-bar distributor, wherein each row conductor intersects each column conductor at an intersection point, in the vicinity of which the two conductors are connected to one another over a photo-resistor and a rectifier containing a blocking contact, which are disposed in series with one another.

Memories of this type are known in various embodiments, for example in German AS 1 2 66 353 or BBC Information Edition 49, 1967, pages 541–547. Such type of stores have a number of advantages in comparison to conventional cross-bar distributors which employ electro-mechanical switches, among which are reliability of operation, maintenance of small dimensions (thin film technique) and enable a change in programming (manipulation) by a simple exchanging of the mask. However, they are comparatively expensive to produce as the (vacuum) vapor deposition of thin layers necessitates a sequence of operational steps which must be very carefully effected and matched to one another.

BRIEF SUMMARY OF THE INVENTION

The invention has among its objects the production of a semi-conductor read-only memory of relatively very simple construction which can be produced at a reasonable cost and in a manner suitable for mass production, requiring, in particular, but a few vapor deposition steps. These results are achieved, in accordance with the invention, in that the blocking contact is formed directly on one of the two conductors, with the photo-resistor preferably consisting of CdS, CdSe, $CdS_xSe_{l-x}$ or PbS.

In accordance with the invention, the memory is constructed with a blocking contact on the particular conductor, whereby the rectifier is disposed ahead instead of behind the photo-resistor, in the current flow direction, whereby all additional contacting elements or layers between conductors, photo-resistor or rectifier can be eliminated, without undergoing any impairment in quality in the low resistance and blocking contacts.

In one embodiment of the invention, utilizing especially few layers, the first conductor of the memory is in direct blocking contact with the photo resistor, which contact, per se, forms the rectifier of the switch are. Cu, Au or Ag may, in particular, be employed as conductor materials.

In another embodiment of the invention, a semiconductor layer is disposed between the photo-element and the particular conductor, which layer together with the photo-resistor forms a low resistance contact and with the conductor forms a blocking contact. Such semi-conductor intermediate layer produces a good rectifier action, and in this case Ag is particularly suitable as the material for the first conductor.

In accordance with a third embodiment of the invention, there is disposed between the photo-resistor and the conductor (which in this case comprises a metal II) is a double layer of the type metal I-oxide of the metal I. The contacting parts are so selected that the combination of metal I oxide and metal II acts as a diode, with blocking contact between the oxide and the metal II. An example of a combination of this type is, for example, titanium-titanium oxide-gold. The double layer design provides a particularly long-term stability in the rectifier.

From "Electronic-Industry", 6th Edition, 1970, page 151, there is disclosed a CdS punched card read device employing only three layers. In this known card read device there is employed a transparent electrode, a CdS photo-conductor and a metal electrode which are arranged in a so-called sandwich construction on a glass substrate, but no disclosure appears with reference to the formation of a blocking contact.

In accordance with the invention, the components of the read-only memory may be adapted to various mask formats (punched card standards) within comparatively wide limits. The memory thus can be employed wherever data input, by means of light is to be stored or converted, and thus quite generally as a read-matrix in a program control, for example in industrial production processes, for the programming of automatic telephone dialling equipment, or in automated household equipment, such as washing machines and the like.

BRIEF DESCRIPTION OF THE DRAWINGS

In the drawings wherein like reference characters indicate like or corresponding parts.

DETAILED DESCRIPTION OF EXEMPLARY EMBODIMENTS OF THE INVENTION

Figure 1:
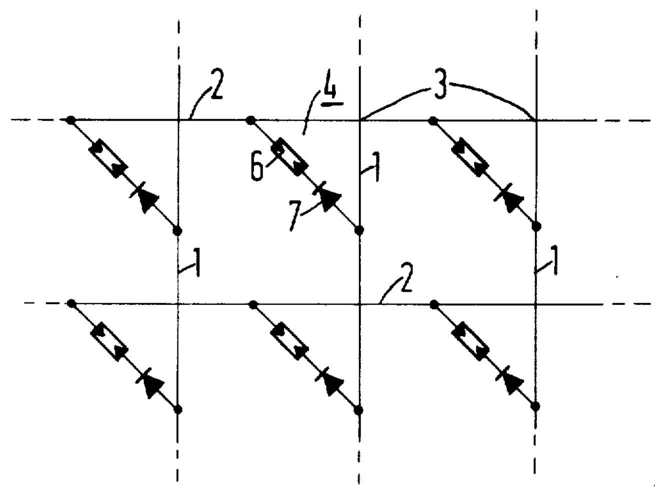
FIG. 1 is a circuit diagram illustrating the switching connections of a read-only memory in accordance with the invention.

Referring to the drawings and more particularly to FIG. 1, in which is illustrated a portion of a read-only memory in accordance with the invention, a plurality or family of column conductors 1 are disposed in intersecting relation with respect to a plurality or family of row conductors 2, creating intersection points 3. Thus, at each of such intersection points 3 a column conductor, hereinafter generally referred to as a first conductor of a pair of conductors, intersects a row conductor, hereinafter referred to as the second conductor of a pair (which designations could be reversed). Both conductors of a pair are connected in the vicinity of their intersection point 3 by a switch arm designated generally by the numeral 4, comprising a photo-resistor 6 and a rectifier 7, for example a diode. It will be particularly noted that, as considered in the current flow direction, the diode 7 is disposed ahead of the photo-resistor 6 while the two conductors are insulated from one another at the intersection point 3. Each switch arm includes a diode to insure that only one current direction is permitted to a pair of switched-through or energized conductors, and thus prevents the formation of by-pass current paths which might produce incorrect signals during the scanning of an unexposed storage location. Thus, in the present read-only matrix there is a clear assignment of the interrogated signals and their corresponding storage locations.

Figure 2:
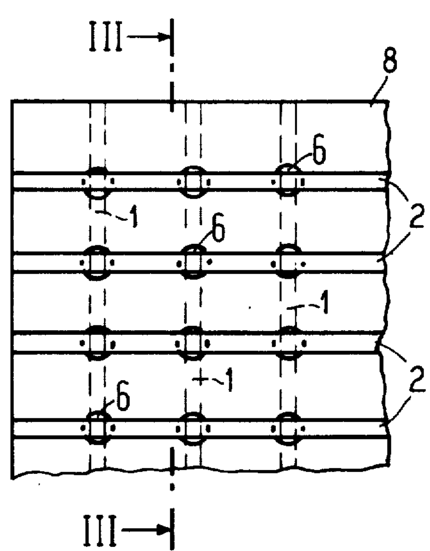
FIG. 2 is a plan view of a first embodiment of the invention.
Figure 3:
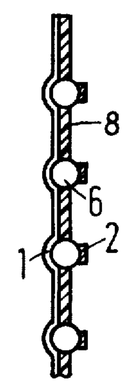
FIG. 3 is a sectional view of the structure of FIG. 2, taken approximately on the line III—III of FIG. 2.

FIGS. 2 and 3 illustrate an example of the combination of first conductor-photo-resistor and second conductor, with a low resistance contact provided between the second conductor and the photo-resistor and with a blocking contact provided between the photo-resistor and the first conductor. A monogranular foil 8 carries photo-resistors 6 comprising sensitized, photo-sensitive material in crystalline form. Deposited upon one side of the foil is a radiation-permeable pattern of parallel strips, forming the second conductors, in the form of a metal or conductive glass, for example $SnO_2$, which is vapor deposited on the one foil side. Both of such materials produce a low resistance contact on the photo-resistors of, for example CdS, CdSe, $CdS_xSe_{l-x}$ or PbS. The metals can, for example, be in the form of In, Ga, or Al. Vapor-deposited upon the other side of the foil is a pattern of parallel strips of metal, forming the first conductors, which strips form blocking contacts with the respective photo-resistors 6, Cu, Au, Ag being metals suitable for this purpose. The photo-elements 6 are in the form of mono-crystals having an approximate size of 60 microns.

In this exemplary embodiment of the invention, if an intersection point 3 of the metal strips, at opposite sides of the monogranular foil 8, are exposed to light, the intermediate photo-conductive granules exhibit a low resistance and operatively connect the conductors. By changing the polarity it is possible to break the connection to the diode and thus, if for example, it was desired to employ the read-matrix in automatic dialling telephone equipment, thereby prevent cross-talk.

In the above described embodiment of the invention, the switch arm 4 forms, per se, the insulation between the two conductors of a pair and any additional conductor insulation can be omitted. The combination of first conductor, photo-resistor, second conductor can also be realized by utilization of a switch are which is not disposed directly at the intersection point, and in this case the following construction has proved advantageous.

A matrix of photo-resistors 6 is vapor-deposited in vacuum onto a substrate of glass or ceramic, for example, "Ker 223" or $Al_2O_3$, and suitably sensitized, for example preferably by a powder sensitization process with the photo-resistors being so arranged that they coincide, for example, with the perforations of a standard punched card or other type of punched card. The photo-resistors 6, as illustrated in FIG. 1, are connected to one another in the manner of a cross-bar distributor, and the conductors 1 and 2 are electrically isolated from one another at the intersection points 3 by vapor-deposited glass, SiO, $SiO_2$, $As_2S_3$, lacquer, by oxidizing the conductor path surface or by use of a thixotropic two-component epoxy resin without fillers.

The second conductors in each case comprise a metal which forms a low resistance contact with the photo-resistor, while the first conductors likewise are metallic and form a blocking contact with the photo-resistor.

Of the above referred insulators, epoxy resin is, in most cases, particularly suitable for a reasonably priced mass production, as it can be applied in simple manner at comparatively low temperatures and is a reliable insulator. On the other hand, the vapor-deposition of a layer subjects the other components, in particular the temperature-sensitive photo-conductor, to a considerably greater thermal load and can be kept free of holes (so-called "pin-holes") i.e., voltage-resistant, only by a relatively large expenditure. The epoxy-resin-insulating layer, for example a resin such as offered by Epoxy Technology Inc., under the trade name EPO-TEK. H54, can be expediently produced by a simple "silk-screen" printing operation. The screen may be in the form of a metal template which can be very precisely produced by a photographic process and subsequent etching. The matrix pattern may be produced in any size without difficulties, and the thickness of the insulating layer can be accurately determined by selecting a specific metal thickness for the metal template.

Following the printing operation, the epoxy resin is hardened at a temperature of 130° C for approximately 15 minutes. The hardened layer exhibits no holes and has a uniform thickness of a few hundred $\mu m$, in dependence upon the metal thickness employed in connection with the printing. For very sensitive layers and components it is possible to further reduce the hardening temperature, which however will necessitate a lengthening of the hardening period. In this connection a thixotropic epoxy resin is to be understood as a resin which will flow basically only under pressure.

In a second embodiment of the invention, there is utilized for each component assembly, the combination of first conductor, semi-conductor layer-photo-resistor, and second conductor with a low resistance contact between the second conductor and the photo-resistor, as well as between the photo-resistor and the semiconductor layer, and with a blocking contact between the semiconductor layer and the first conductor.

Figure 4:
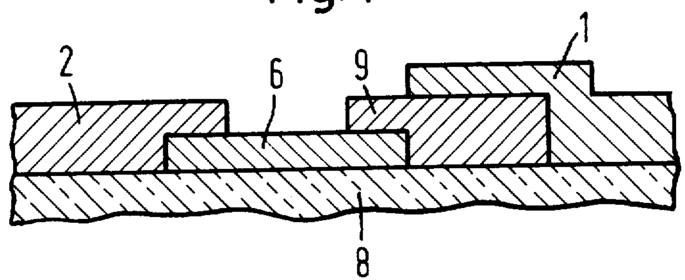
FIG. 4 is a schematic transverse section of a component employed in a second embodiment of the invention.

FIG. 4 schematically illustrates, in section, the construction of such a component. In this construction the photo-resistor 6 is initially vapor-deposited on a substrate 8, followed by deposition of the second conductor 2 and semiconductor 9, each of which partially overlap the photo-resistor 6, and finally the first conductor 1 which likewise partially overlaps the semiconductor layer 9.

This embodiment may be constructed in a manner very similar to that described with respect to the first embodiment. Where the memory features a monogranular plate, such as illustrated in FIGS. 2 and 3, a strip pattern of suitable semiconductor layers, for example Se and/or Te is vapor-deposited on the second side of the foil, following which a metal is vapor-deposited upon the semiconductor layer, forming a blocking contact therewith, utilizing, for example, Ag. Where this embodiment is employed on a substrate carrier, initially a layer of Se and/or Te is vapor-deposited onto the layer of the photo-resistor 6, with the deposited layer partially overlapping the photo-resistor as illustrated in FIG. 4. Se and Te form a non-blocking contact with CdS, CdSe, $CdS_xSe_{1-x}$. There is then vapor-deposited on the Se or Te, as the first conductor, a metal which forms a blocking contact with the latter, possibly by subsequent thermal and electrical treatment, and produces diode characteristics.

Figure 5:
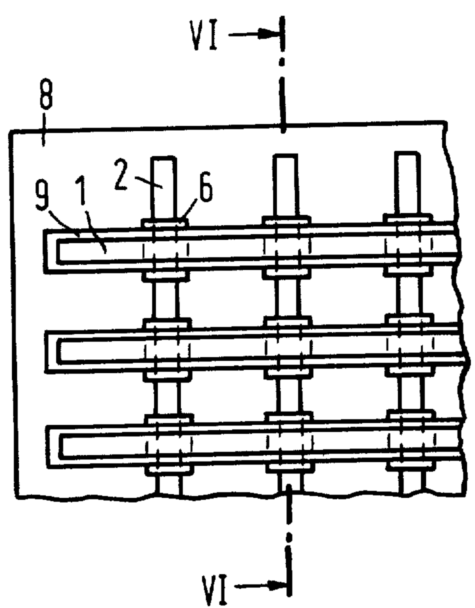
FIG. 5 is a plan view of the second embodiment of the invention.
Figure 6:
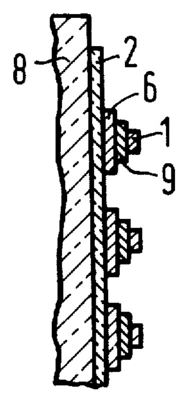
FIG. 6 is a sectional view of the second embodiment taken approximately on the line VI—VI of FIG. 5.

In another embodiment of the second design, a pattern of parallel strips of a conductive glass, for example Nesa or $SnO_2$ is vapor-deposited upon a substrate carrier of glass or ceramic and forms the second conductor. Over the strip pattern of conductive glass is arranged a pattern of CdS, CdSe, $CdS_xSe_{l-x}$, PbS or another photo-sensitive layer which is sensitized by thermo-diffusion or other process. A pattern of radiation-transmissive semiconductor-metal combination i.e., semi-conductor 9 and metal strips 1 is then vapor-deposited upon the photo-sensitive layer (photo-resistor 6) at right angles to the conductive glass strips and produces a blocking contact on the photo-sensitive layer. If an intersection point of the two patterns is exposed to light, the intermediate photo-sensitive layer exhibits low resistance and operatively connects the two conductor paths. The blocking contact again facilitates the electrical insulation of the conductor paths and thus their decoupling. (See FIGS. 5 and 6).

A further embodiment comprises components which are constructed in accordance with the pattern of second conductor, photo-element, metal I, oxide of the metal I, metal II (first conductor). This embodiment may be produced in the following manner, in which the conductor 2 comprises a metal, for example, A1 which forms a low resistance contact with the above-mentioned photo-sensitive materials. The photo-resistor 6 is contracted by Ti, i.e., as metal I, which is vapor-deposited in a high vacuum. A gold-platinum or a palladium electrode is then vapor-deposited upon the Ti surface and functions as the first conductor, with the titanium-titanium oxide-gold (platinum, palladium) contact acting as a rectifier. In this case insulation of the row and column conductors may be effected by surface oxidation of the second conductor. It is possible to employ the eloxal process or to carry out oxidation in an oxygen plasma.

Having thus described our invention it will be obvious that although various minor modifications might be suggested by those versed in the art, it should be understood that we wish to embody within the scope of the patent granted hereon all such modifications as reasonably, and properly come within the scope of our contribution to the art.

We claim as our invention:

1. In a manipulatable read-only memory, particularly a punched card read device, having a group of first conductors and a group of second conductors, one group forming row conductors and the other group forming column conductors, which are disposed in a matrix formation in the manner of a cross-bar distributor, with each first conductor intersecting the second conductors at respective intersection points, the combination of each pair of first and second conductors being operatively connected in the vicinity of their intersection point by a corresponding series connected photo-resistor and a rectifier containing a blocking contact, said blocking contact being formed directly on the first conductor and directly connecting the latter, in blocking manner, to the photo-resistor, the photo-resistor being in the form of a crystal which extends through a monogranular supporting foil, the second conductor being vapor deposited in the form of beam-transmissive strips, upon one of the two sides of the foil, and the first conductor being vapor deposited upon the other of the two sides of the foil.

2. A manipulatable read-only memory according to claim 1, in which the conductors are insulated from each other at their intersection points by an insulating layer comprising a thixotropic two-component epoxy resin without fillers.

3. A manipulatable read-only memory according to claim 1, wherein the second conductor comprises a conductive glass preferably $SnO_2$.

4. In a manipulatable read-only memory, particularly a punched card read device, having a group of first conductors and a group of second conductors, one group forming row conductors and the other group forming column conductors, which are disposed in a matrix formation in the manner of a cross-bar distributor, with each first conductor intersecting the second conductors at respective intersection points, the combination of each pair of first and second conductors being operatively connected in the vicinity of their intersection point by a corresponding series connected photo-resistor and a rectifier containing a blocking contact, a semiconductor layer disposed on the first conductor, and lying between the latter and the photo-resistor, which layer forms a low resistance contact with the photo-resistor and forms said blocking contact directly on the first conductor, said photo-resistor, being in the form of a crystal, which extends through a monogranular supporting foil, with the second conductor being in the form of a radiation-transmissive strip, vapor deposited upon one of the two sides of the foil, and the semiconductor layer together with the first conductor being vapor deposited upon the other side of the foil.

5. In a manipulatable read-only memory, particularly a punched card read device, having a group of first conductors and a group of second conductors, one group forming row conductors and the other group forming column conductors, which are disposed in a matrix formation in the manner of a cross-bar distributor, with each first conductor intersecting the second conductors at respective intersection points, the combination of each pair of first and second conductors being operatively connected in the vicinity of their intersection point by a corresponding series connected photo-resistor and a rectifier containing a blocking contact, said blocking contact being formed directly on the first conductor, the first conductor comprising metal (metal II) and between the latter and the photo-resistor is disposed a double layer of a metal (metal I) and an oxide of the metal I, with the metal I - oxide-metal II double layer acting as a diode with a blocking contact between the oxide and the metal II.

6. A manipulatable read-only memory according to claim 5, in which the conductors are insulated from one another at their intersection points by surface oxidation on the second conductor.

7. A manipulatable read-only memory according to claim 5, in which the conductors are insulated from each other at their intersection points by an insulating layer comprising a thixotropic two-component epoxy resin without fillers.

8. A manipulatable read-only memory according to claim 5, wherein the first conductor comprises Au, Pt or Pd.

9. In a manipulatable read-only memory, particularly a punched card read device, having a group of first conductors and a group of second conductors, one group forming row conductors and the other group forming column conductors, which are disposed in a matrix formation in the manner of a cross-bar distributor, with each first conductor intersecting the second conductors at respective intersection points, the combination of each pair of first and second conductors being operatively connected in the vicinity of their intersection point by a corresponding series connected photo-resistor and a rectifier containing a blocking contact, said blocking contact being formed directly on the first conductor and directly connecting the latter, in blocking manner, to the photo-resistor, the first conductor being selected from the group comprising Cu, Au and Ag.

10. In a manipulatable read-only memory, particularly a punched card read device, having a group of first conductors and a group of second conductors, one group forming row conductors and the other group forming column conductors, which are disposed in a matrix formation in the manner of a cross-bar distributor, with each first conductor intersecting the second conductors at respective intersection points the combination of each pair of first and second conductors being operatively connected in the vicinity of their intersection point by a corresponding series connected photoresistor and a rectifier containing a block contact, a semiconductor layer of Se disposed on the first conductor, and lying between the latter and the photo-resistor, which layer forms a low resistance contact with the photo-resistor and directly forms said blocking contact with the first conductor.

11. A manipulatable read-only memory according to claim 10, in which the conductors are insulated from each other at their intersection points by an insulating layer comprising a thixotropic two-component epoxy resin without fillers.

12. In a manipulatable read-only memory, particularly a punched card read device, having a group of first conductors and a group of second conductors, one group forming row conductors and the other group forming column conductors, which are disposed in a matrix formation in the manner of a cross-bar distributor, with each first conductor intersecting the second conductors at respective intersection points, the combination of each pair of first and second conductors being operatively connected in the vicinity of their intersection point by a corresponding series connected photo-resistor and a rectifier containing a blocking contact, a semiconductor layer being disposed on the first conductor, and lying between the latter and the photo-resistor, which layer forms a low resistance contact with the photo-resistor and forms said blocking contact directly on the first conductor, the semiconductor layer and the first conductor comprising radiation-transmissive material and the photo-resistor and the semi-conductor layer being disposed between the two conductors at the point of their intersection.

13. A manipulatable read-only memory according to claim 12, wherein the second conductor comprises a conductive glass.

* * * * *